(12) United States Patent
Choi et al.

(10) Patent No.: US 7,749,801 B2
(45) Date of Patent: Jul. 6, 2010

(54) PHASE CHANGE MEMORY DEVICE USING CARBON NANOTUBE AND METHOD FOR FABRICATING THE SAME

(75) Inventors: Yang-Kyu Choi, Daejeon (KR); Kuk-Hwan Kim, Daejeon (KR)

(73) Assignee: Korea Advanced Institute of Science & Technology, Daejeon (KR)

( * ) Notice: Subject to any disclaimer, the term of this patent is extended or adjusted under 35 U.S.C. 154(b) by 350 days.

(21) Appl. No.: 11/610,341

(22) Filed: Dec. 13, 2006

(65) Prior Publication Data

US 2007/0158697 A1      Jul. 12, 2007

(30) Foreign Application Priority Data

Jan. 5, 2006     (KR) ...................... 10-2006-0001336

(51) Int. Cl.
  *H01L 21/00* (2006.01)
(52) U.S. Cl. .......................... 438/95; 977/700; 977/742; 977/750; 977/752
(58) Field of Classification Search .................. 977/750
See application file for complete search history.

(56) References Cited

U.S. PATENT DOCUMENTS

| 2004/0251551 | A1 | 12/2004 | Hideki | |
|---|---|---|---|---|
| 2006/0263289 | A1* | 11/2006 | Heo et al. | 423/447.3 |
| 2007/0012956 | A1* | 1/2007 | Gutsche et al. | 257/246 |
| 2007/0278530 | A1* | 12/2007 | Seidl | 257/213 |
| 2007/0292985 | A1* | 12/2007 | Zhang | 438/95 |

* cited by examiner

*Primary Examiner*—Ha Tran T Nguyen
*Assistant Examiner*—Valerie Brown
(74) *Attorney, Agent, or Firm*—Foley & Lardner LLP

(57) ABSTRACT

Provided are a phase change memory device that can operate at low power and improve the scale of integration by reducing a contact area between a phase change material and a bottom electrode, and a method for fabricating the same. The phase change memory comprises a current source electrode, a phase change material layer, a plurality of carbon nanotube electrodes, and an insulation layer. The current source electrode supplies external current to a target. The phase change material layer is disposed to face the current source electrode in side direction. The carbon nanotube electrodes are disposed between the current source electrode and the phase change material layer. The insulation layer is formed outside the carbon nanotube electrodes and functions to reduce the loss of heat generated at the carbon nanotube electrodes.

13 Claims, 6 Drawing Sheets

PHASE CHANGE MEMORY DEVICE USING CARBON NANOTUBE AND METHOD FOR FABRICATING THE SAME

This nonprovisional application claims priority under 35 U.S.C. §119(a) on Patent Application No. 10-2006-0001336 filed in Republic of Korea on Jan. 5, 2006, the entire contents of which are hereby incorporated by reference.

BACKGROUND

1. Field

The present invention relates to a phase change memory device, and more particularly, to a phase change memory device using a carbon nanotube to allow operation at low power and large scale of integration, and a method for fabricating the same.

2. Description of the Background Art

A phase change memory device is a type of memory that stores information using an electrical conductivity difference between a crystalline phase and an amorphous phase of a specific material.

Such a phase change memory device has received a great attention as a next generation non-volatile memory due to its unique characteristics such as large threshold voltage margin, rapid operation speed, excellent durability, and long data retention time. Furthermore, many researchers have recently reported about successful mass production of phase change memory devices that can be scaled equivalent to commercial flash memory devices.

The size of memory cells and operation of memory cells need to be maintained uniform in order for phase change memory devices to become a major next generation memory. The magnitude of operation current affects the size of the memory cells, and a contact area between a phase change material and a bottom electrode affects the magnitude of the necessary operation current. Therefore, the contact area between the phase change material and the bottom electrode is aimed to be reduced so as to have high density of the operation current with a small amount of operation current.

However, when etching is performed to form a bottom electrode in a phase change memory device, it is usually difficult to form a contact between the bottom electrode and a phase change material with a uniform diameter. Also, the size of the contact needs to be small to have high current density; however, in addition to the difficulty in obtaining the uniform contact size, downsizing the contact is another limitation in fabricating highly integrated phase change memory devices. As a result, improving reliability of phase change memory devices and the scale of integration may be limited.

Two approaches are suggested to achieve the large scale of integration in phase change memory devices based on the reduction in the size of the memory cells.

First, the size of the memory cells of the phase change memory devices can be reduced by reducing the contact area between the phase change material and the bottom electrode.

Second, resistance of the bottom electrode, which acts as a heating material, is increased to generate a large amount of heat under the same current density. As a result of this heat generation, the size of the memory cells of the phase change memory devices can be reduced. According to the known Joule definition, heat transferred to the phase change material is proportional to the resistance of a heat generating material and to the square of an amount of current flowing through the heat generating material.

On the basis of the above facts, a structure of a typical phase change memory device will be described hereinafter.

Small openings are formed in a bottom portion of a phase change material, and a bottom electrode, which is a heat generating material, fills the openings. As a result, the contact area between the bottom electrode and the phase change material is two-dimensional. In the typical phase change memory device, since operation current supplied from outside flows widely as much as the contact area, it is often difficult to obtain an amount of heat sufficient to cause a phase transition.

Hence, a method of forming a ring-type contact is introduced to overcome the above difficulty. In a phase change memory device using this ring-type contact, a heat generating material, i.e., the bottom electrode, fills only the surface of small openings, and an insulation material fills the rest of the small openings.

FIG. 1a is a perspective view of a typical phase change memory device structure. FIG. 1b is a sectional view of the typical phase change memory device structure cut in a 1b-1b' direction illustrated in FIG. 1a. FIG. 1c is a top view of a bottom electrode of the typical phase change memory device.

Referring to FIG. 1a, in the typical ring-type phase change memory device, an external current source electrode 101 that supplies external current to a target and a phase change material layer 105 that shows the characteristics of the phase change memory device face to each other in side direction. A bottom electrode 102, which is a heat generating material, is formed in a ring shape between the external current source electrode 101 and the phase change material layer 105. An insulation material 103 fills the inside of the bottom electrode 102 in the form of a circle to prevent loss of heat outside. A dielectric material 104 encompasses the bottom electrode 102 and the insulation material 103.

In the typical ring-type phase change memory device, the phase change material layer 105 and the bottom electrode 102 contact with each other one-dimensionally in circumference. Thus, as compared with the typical phase change memory device showing the two-dimensional surface contact between the phase change material and the bottom electrode, the ring-type phase change memory device can have high density of operation current even with a small amount of the operation current. As mentioned above, since the insulation material 103 encompasses the bottom electrode 102, the loss of heat generated at the bottom electrode 102 can be blocked.

However, the bottom electrode 102 in the ring-type phase change memory device needs to fill inside of the small openings, and thus, a material for the bottom electrode 102 is selected with limitation. Also, despite of the ring formation method, the scale of integration in the ring-type phase change memory device is usually 50% of that of a currently fabricated flash memory. Hence, even with this ring-type phase change memory device structure, achieving the same or greater scale of integration is limited.

Accordingly, another phase change memory device structure that requires a small amount of operation current needs to be developed.

SUMMARY

Accordingly, the present invention is directed to solve at least the limitations and disadvantages of the background art.

One embodiment of the present invention is directed to provide a phase change memory device using a carbon nanotube that can operate at low power and improve the scale of integration by reducing a contact area between a phase change material and a bottom electrode.

Another embodiment of the present invention is directed to provide a method for fabricating a phase change memory device using a carbon nanotube in which a contact area between a phase change material and a bottom electrode is reduced.

According to one embodiment of the present invention, there is provided a phase change memory using carbon nanotubes comprising a current source electrode supplying external current to a target, a phase change material layer disposed to face the current source electrode in side direction, a plurality of carbon nanotube electrodes disposed between the current source electrode and the phase change material layer, and an insulation layer formed outside the carbon nanotube electrodes.

Consistent with the embodiment of the present invention, each of the carbon nanotube electrodes may have a diameter ranging from approximately 1 nm to 100 nm.

Consistent with the embodiment of the present invention, the carbon nanotube electrodes may be formed in a single wall type.

According to another embodiment of the present invention, there is provided a method for fabricating a phase change memory device using carbon nanotubes, the method comprising disposing a catalyst for forming a plurality of carbon nanotubes over predetermined regions of a current source electrode supplying external current to a target, growing the carbon nanotubes in vertical direction using the catalyst as a seed to form carbon nanotube electrodes, depositing an insulation layer over the current source electrode in a manner to cover the carbon nanotube electrodes, polishing the insulation layer until flush with the carbon nanotube electrodes, and forming a phase change material layer over the planarized insulation layer in contact with the carbon nanotube electrodes.

Consistent with the other embodiment of the present invention, disposing the catalyst over the predetermined regions of the current source electrode may comprise forming the catalyst using one selected from a group consisting of $Fe_2O_3$, Pt, Co, Ni, Ti, Mo, and a combination thereof.

Consistent with the other embodiment of the present invention, growing the carbon nanotubes in vertical direction using the catalyst as the seed may comprise forming the carbon nanotube electrodes in a single wall type.

Consistent with the other embodiment of the present invention, growing the carbon nanotubes in vertical direction using the catalyst as the seed may comprise forming the carbon nanotube electrodes to have a diameter ranging from approximately 1 nm to 100 nm.

According to still another embodiment of the present invention, there is provided a phase change memory using carbon nanotubes comprising a current source electrode supplying external current to a target, a phase change material layer disposed to face the current source electrode in side direction, a plurality of carbon nanotube electrodes disposed between the current source electrode and the phase change material layer, one portion of the carbon nanotube electrodes extending to overlap with the phase change material layer, and an insulation layer formed outside the carbon nanotube electrodes.

Consistent with the still other embodiment of the present invention, each of the carbon nanotube electrodes may have a diameter ranging from approximately 1 nm to 100 nm.

Consistent with the still other embodiment of the present invention, the carbon nanotube electrodes may have an overlapping length with the phase change material layer in a range of approximately 1/10 to 9/10 of the total length of the carbon nanotube electrodes.

Consistent with the still other embodiment of the present invention, the carbon nanotube electrodes may be formed in a single wall type.

According to further another embodiment of the present invention, there is provided a method for fabricating a phase change memory device using carbon nanotubes, the method comprising disposing a catalyst for forming a plurality of carbon nanotubes over predetermined regions of a current source electrode supplying external current to a target, growing the carbon nanotubes in vertical direction using the catalyst as a seed to form carbon nanotube electrodes, depositing an insulation layer over the current source electrode in a manner to cover the carbon nanotube electrodes, polishing the insulation layer until flush with the carbon nanotube electrodes, selectively etching the planarized insulation layer to make the carbon nanotube electrodes exposed substantially at the same level of the planarized insulation layer protrude, and forming a phase change material layer over the etched insulation layer such that the carbon nanotube electrodes overlap with the phase change material layer.

Consistent with the further other embodiment of the present invention, disposing the catalyst over the predetermined regions of the current source electrode may comprise forming the catalyst using one selected from a group consisting of $Fe_2O_3$, Pt, Co, Ni, Ti, Mo, and a combination thereof.

Consistent with the further other embodiment of the present invention, growing the carbon nanotubes in vertical direction using the catalyst as the seed may comprise forming the carbon nanotube electrodes in a single wall type.

Consistent with the further other embodiment of the present invention, growing the carbon nanotubes in vertical direction using the catalyst as the seed may comprise forming the carbon nanotube electrodes to have a diameter ranging from approximately 1 nm to 100 nm.

Consistent with the further other embodiment of the present invention, selectively etching the planarized insulation layer to make the exposed carbon nanotube electrodes protrude may comprise etching the planarized insulation layer such that a protruding length of the carbon nanotube electrodes ranges from approximately 1/10 to 9/10 of the total length of the carbon nanotube electrodes.

According to still further another embodiment of the present invention, there is provided a phase change memory using carbon nanotubes comprising a current source electrode supplying external current to a target, a phase change material layer disposed to face the current source electrode in side direction, a plurality of carbon nanotube electrodes disposed between the current source electrode and the phase change material layer, an insulation layer formed outside the carbon nanotube electrodes, and a heat generating resistance layer disposed between the carbon nanotube electrodes and the phase change material layer in contact with the carbon nanotube electrodes.

Consistent with the still further other embodiment of the present invention, each of the carbon nanotube electrodes may have a diameter ranging from approximately 1 nm to 100 nm.

Consistent with the still further other embodiment of the present invention, the carbon nanotube electrodes may be formed in a single wall type.

According to even further another embodiment of the present invention, there is provided a method for fabricating a phase change memory device using carbon nanotubes, the method comprising disposing a catalyst for forming a plurality of carbon nanotubes over predetermined regions of a current source electrode supplying external current to a target, growing the carbon nanotubes in vertical direction using the catalyst as a seed to form carbon nanotube electrodes, depositing an insulation layer over the current source electrode in a manner to cover the carbon nanotube electrodes, polishing the insulation layer until flush with the carbon nanotube electrodes, depositing a heat generating resistance layer over the planarized insulation layer to contact the carbon nanotube electrodes exposed substantially at the same level of the planarized insulation layer, and forming a phase change layer over the heat generating resistance layer.

Consistent with the even further other embodiment of the present invention, disposing the catalyst over the predetermined regions of the current source electrode may comprise forming the catalyst using one selected from a group consisting of $Fe_2O_3$, Pt, Co, Ni, Ti, Mo, and a combination thereof.

Consistent with the even further other embodiment of the present invention, growing the carbon nanotubes in vertical direction using the catalyst as the seed may comprise forming the carbon nanotube electrodes in a single wall type.

Consistent with the even further embodiment of the present invention, growing the carbon nanotubes in vertical direction using the catalyst as the seed may comprise forming the carbon nanotube electrodes to have a diameter ranging from approximately 1 nm to 100 nm.

The present invention will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the same reference numerals in different drawings represent the same element.

BRIEF DESCRIPTION OF THE DRAWINGS

The accompanying drawings, which are comprised to provide a further understanding of the invention and are incorporated in and constitute a part of this specification, illustrate embodiments of the invention and together with the description serve to explain the principles of the invention. In the drawings:

FIG. 1b is a sectional view of the typical phase change memory device structure cut in a 1b-1b' direction illustrated in FIG. 1a;

FIG. 2b is a sectional view of the phase change memory device structure cut in a 2b-2b' direction illustrated in FIG. 2a;

DETAILED DESCRIPTION OF EMBODIMENTS

Various embodiments of a phase change memory device using a carbon nanotube and a method for fabricating the same will be described in a more detailed manner with reference to the attached drawings.

Figure 2A:
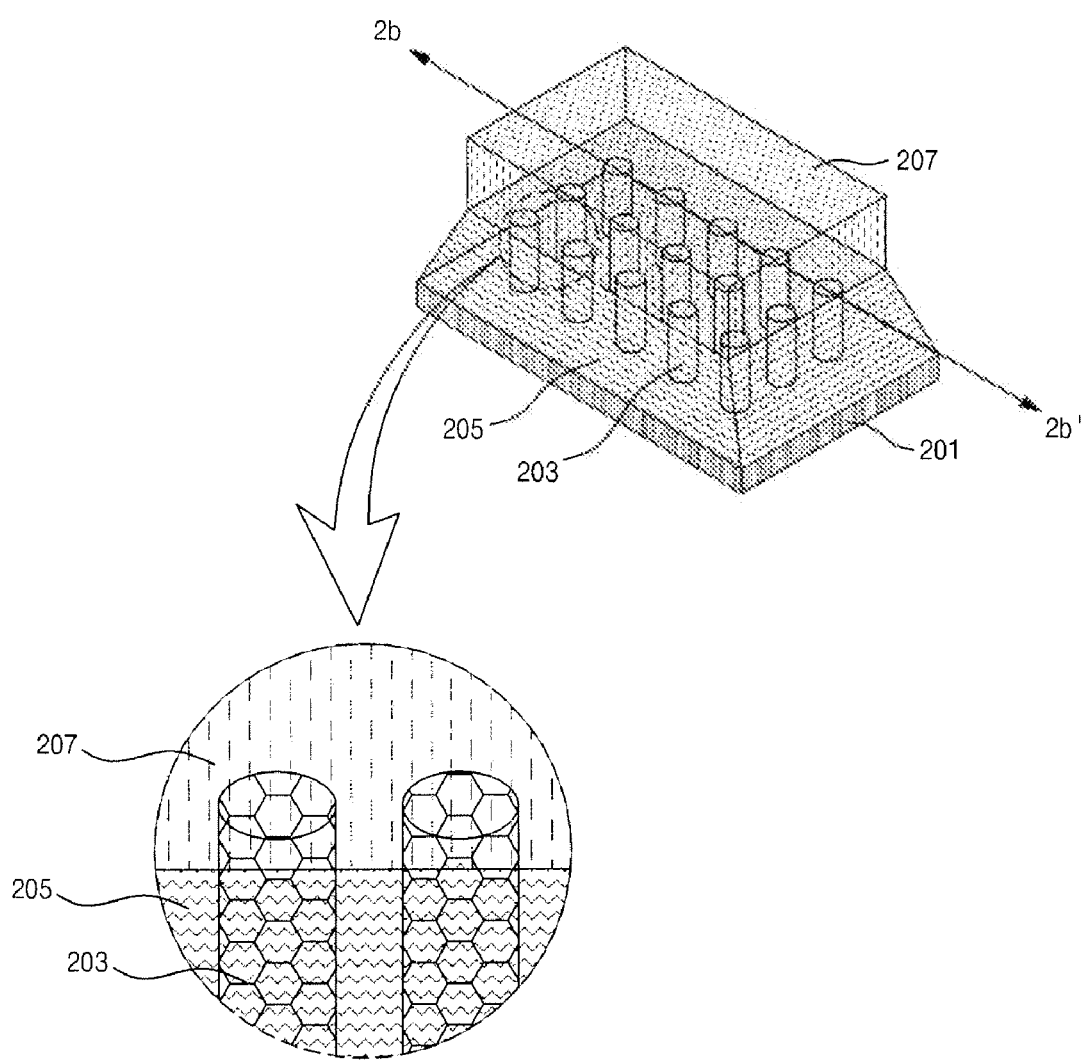
FIG. 2a is a perspective view of a phase change memory device structure according to an embodiment of the present invention.
Figure 2B:
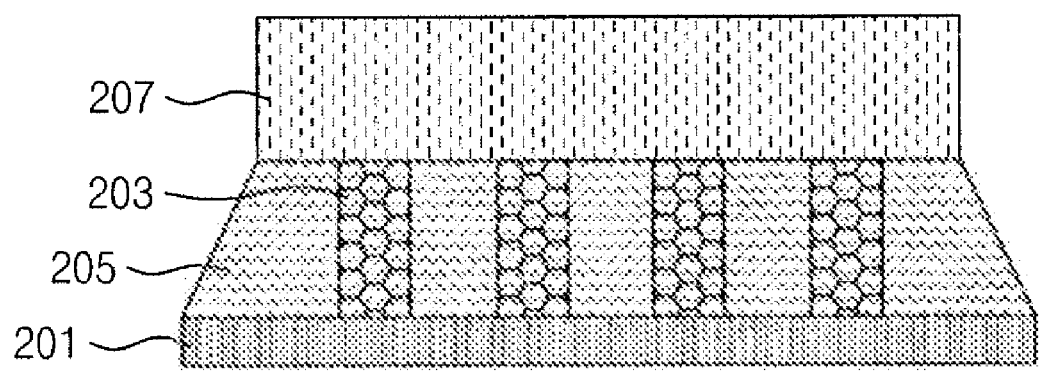
Figure 2C:
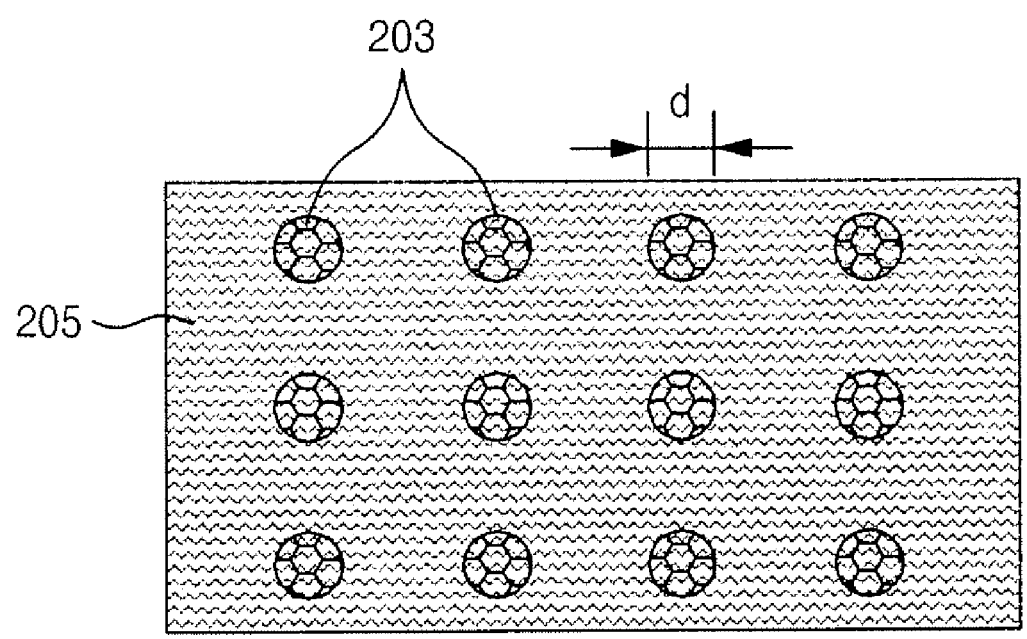
FIG. 2c is a top view of a bottom electrode of the phase change memory device according to the embodiment of the present invention.

FIG. 2a is a perspective view of a phase change memory device structure according to an embodiment of the present invention. FIG. 2b is a sectional view of the phase change memory device structure cut in a 2b-2b' direction illustrated in FIG. 2a. FIG. 2c is a top view of a bottom electrode of the phase change memory device according to the embodiment of the present invention.

Referring to FIG. 2a, the phase change memory device comprises a current source electrode 201, a phase change material layer 207, a plurality of carbon nanotube electrodes 203, and an insulation layer 205. The current source electrode 201 supplies external current to a target. The phase change material layer 207 is disposed to face the current source electrode 201 in side direction. The carbon nanotube electrodes 203 are arranged between the current source electrode 201 and the phase change material layer 207, and the insulation layer 205 is formed outside the carbon nanotube electrodes 203.

The current source electrode 201 supplies external current to a target to achieve an intended level of current density necessary for inducing a phase change in the phase change material layer 207.

Figure 1A:
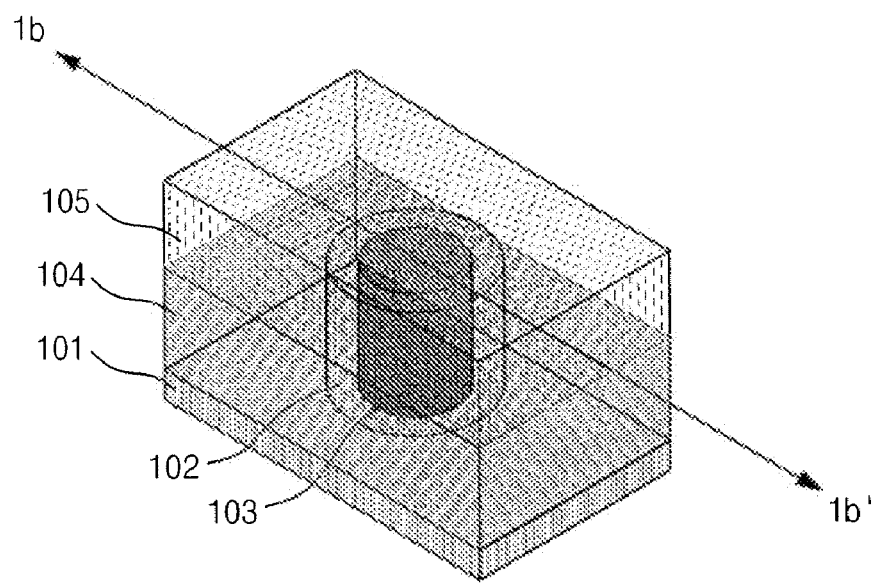
FIG. 1a is a perspective view of a typical phase change memory device structure.
Figure 1B:
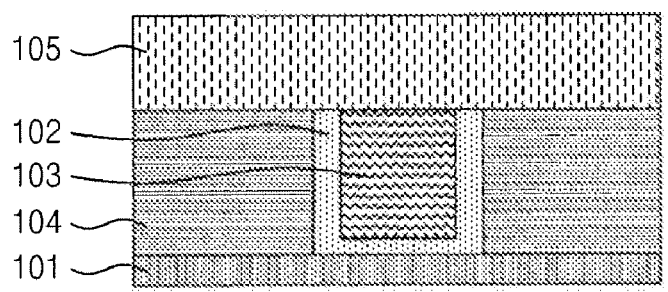
Figure 1C:
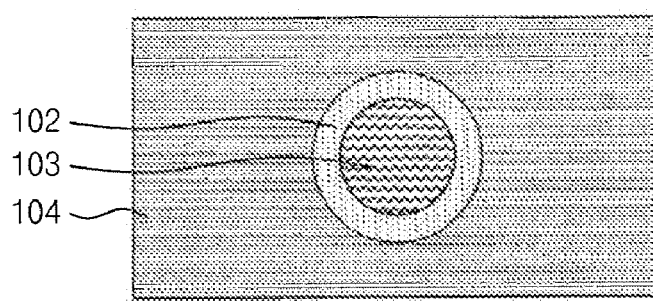
FIG. 1c is a top view of a bottom electrode of the typical phase change memory device.

The carbon nanotube electrodes 203 are arranged between the current source electrode 201 and the phase change material layer 207 and make contact with the phase change material layer 207. The carbon nanotube electrodes 203 transfer the external current, which is necessary for inducing the phase change in the phase change material layer 207, from the current source electrode 201 to the phase change material layer 207. In addition to this role, the carbon nanotube electrodes 203 function as a heat generating material, functionally corresponding to the typical bottom electrode 102 (see FIG. 1a).

As illustrated in FIG. 2c, the carbon nanotube electrodes 203 may be formed in a predetermined pattern having certain regularity in size and arrangement. However, the carbon nanotube electrodes 203 may still be formed without having the predetermined pattern.

A diameter 'd' of each of the carbon nanotube electrodes 203 ranges from approximately 1 nm to 100 nm, and this range means that the carbon nanotube electrodes 203 have a small area being close to the form of a dot. Particularly, the carbon nanotube electrodes 203 may be formed in a single wall type, which usually has high resistance. The reason for forming the single wall type carbon nanotube electrodes 203 is to generate a large amount of heat substantially with the same current density through increasing the resistance of the carbon nanotube electrodes 203, which serve as a heat generating material. Detailed description of the heat generation will be described later.

The insulation layer 205 encompasses the outside of the carbon nanotube electrodes 203 disposed between the current source electrode 201 and the phase change material layer 207. This structural characteristic of the insulation layer 205 disallows heat generated at the carbon nanotube electrodes 203 to be transferred outside. The insulation layer 205 comprises one selected from a group consisting of $SiO_2$, $Si_4N_4$, $HfO_2$, $ZrO_2$, $Ta_2O_5$, $Al_2O_3$, $La_2O_3$, $Y_2O_3$, and $CeO_2$.

The phase change material layer 207 is a memory layer that stores information using an electrical conductivity difference in a phase change material. The phase change material usually has two different phases such as amorphous phase and crystalline phase. Since amorphous phase has high specific resistance than crystalline phase, amorphous and crystalline phases of the phase change material can be distinguished from each other. Therefore, as the phase change material layer 207 is electrically heated by which current flows from the carbon nanotube electrodes 203, the amorphous and crystalline phases of the phase change material are changed reversibly from each other, allowing storing information.

In the phase change memory device according to the embodiment of the present invention, the carbon nanotube electrodes 203, which are heat generating materials, contact the phase change material layer 207. At this time, the contact area is small, substantially corresponding to the diameter of the carbon nanotube electrodes 203. Thus, as compared with the ring-type phase change memory device in which the phase change material layer and the heat generating material make one dimensional surface contact in circumference, the contact area of the phase change memory device according to the present invention decreases to a great extent.

As a result of this effect, the phase change memory device according to the present invention shows several characteristics that allow more enhanced scale of integration as compared with the typical phase change memory device.

In detail, first, the carbon nanotubes are used to form bottom electrodes of the phase change memory device. As mentioned above, the bottom electrodes are the current passage between the current source electrode 201 and the phase change material layer 207. As a result, an amount of operation current necessary for the phase change can be reduced.

That is, each of the carbon nanotube electrodes 203 arranged between the current source electrode 201 and the phase change material layer 207 have a size of approximately 1 nm to 100 nm, thereby forming the small contact area with the phase change material layer 207. Hence, high current density can be obtained even with a small amount of current. Consequently, a large amount of operation current, which often put a burden on improving the scale of integration, is not a limiting factor for improving the scale of integration.

Second, using the carbon nanotubes as the bottom electrodes functioning as the current passage between the current source electrode 201 and the phase change material layer 207 allows utilizing high thermal conductivity of the carbon nanotubes.

In general, the thermal conductivity of a carbon nanotube is two times higher than diamond. For instance, a carbon nanotube is usually known to have a thermal conductivity of approximately 6,000 W/mk. The higher the thermal conductivity, the easier the transfer of heat generated at the carbon nanotube to the outside.

Third, in the phase change memory device according to the embodiment of the present invention, the carbon nanotubes (i.e., the bottom electrodes) are arranged uniformly around the phase change material layer 207, a region responsible for the phase change can be widened.

This widened region allows increasing a threshold voltage margin of the phase change memory device, and thus, multi-level cell (MLC) technology that enables storage of several bits on a single device can be implemented. As a result, the scale of integration of the phase change memory device can be improved.

Fourth, the phase change memory device has different heat generation efficiency depending on electrical properties of the carbon nanotubes.

More specifically, various electrical characteristics appear in the phase change memory device depending on the diameter of the carbon nanotubes and chirality.

Although multi-wall nanotubes (MWNTs) show approximately 99% of similarity in electrical characteristics to metal, MWNTs are not often suitable to be used as bottom electrodes due to low resistance of MWNTs.

Depending on the chirality, single wall nanotube (SWNTs) can be classified into a group of the nanotubes that exhibit semiconductor characteristics and a group of the nanotubes that exhibit metallic characteristics. By using the nanotubes that exhibit the semiconductor characteristics, the resistance of the carbon nanotubes can be increased, and the heat generation efficiency can be improved.

Accordingly, as compared with the typical phase change memory device, the phase change memory device according to the present invention can have an amount of operation current reduced to a great extent, and can be integrated in large scale.

Hereinafter, a method for fabricating the above-described type of phase change memory device will be described.

FIGS. 3a to 3e are sectional views to illustrate a method for fabricating a phase change memory device according to an embodiment of the present invention.

According to the embodiment of the present invention, the method comprises placing a catalyst over predetermined regions of a current source electrode; vertically growing a seed (i.e., the catalyst) to form carbon nanotubes; depositing an insulation layer over the current source electrode in a manner to cover the carbon nanotubes; polishing the surface of the insulation layer; and forming a phase change material layer.

Figure 3A:
FIGS. 3a to 3e are sectional views to illustrate a method for fabricating a phase change memory device according to an embodiment of the present invention.

Referring to FIG. 3A, a catalyst 302 is placed over predetermined regions of a current source electrode 301 supplying external current that is necessary for inducing a phase change to a target. The catalyst 302 is to form carbon nanotubes.

The catalyst 302 comprises one selected from a group consisting of $Fe_2O_3$, Pt, Co, Ni, Ti, Mo, and a combination thereof. As illustrated in FIG. 3a, the catalyst 302 may be formed in a predetermined pattern having regularity in size and arrangement. However, the catalyst 302 may still be formed without having the predetermined pattern.

Figure 3B:
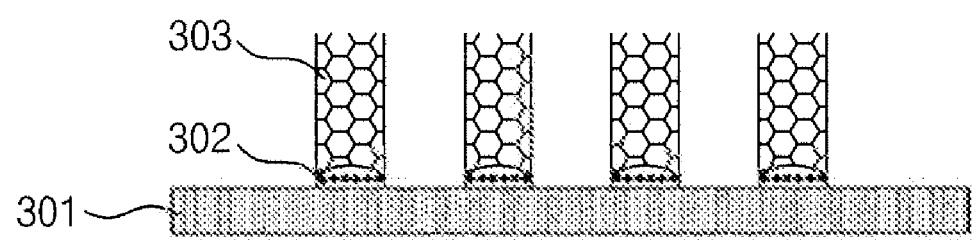

Referring to FIG. 3b, using the catalyst 302, which serves as a seed for carbon nanotubes, the carbon nanotubes are grown vertically in a pillar shape to thereby form carbon nanotube electrodes 303.

The carbon nanotube electrodes 303 are formed in a single wall type with high resistance to generate a large amount of heat due to high resistance of the bottom electrodes (i.e., the carbon nanotube electrodes 303). A diameter of each of the carbon nanotube electrodes 303 ranges from approximately 1 nm to 100 nm. This magnitude of the diameter is small, and thus, the carbon nanotube electrodes 303 have a small sectional area that is very close to a dot.

Figure 3C:
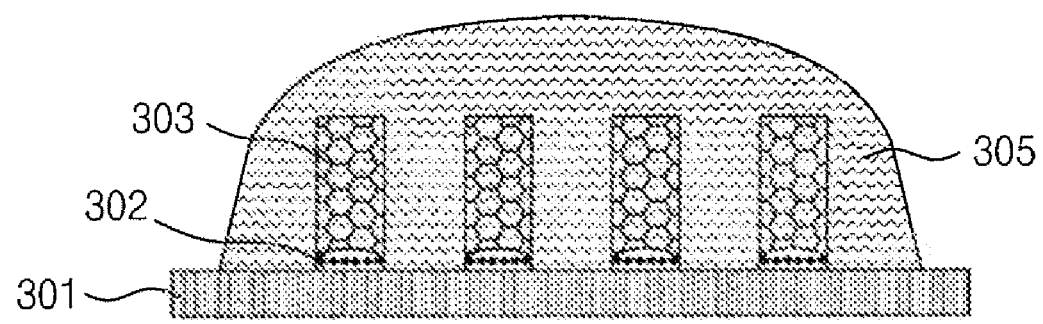

Referring to FIG. 3c, an insulation layer 305 is deposited over the current source electrode but widely enough to cover the pillar-type carbon nanotube electrodes 303.

Figure 3D:
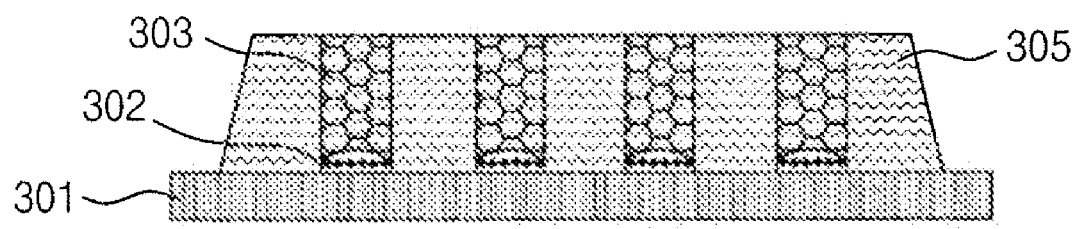

Referring to FIG. 3d, the surface of the insulation layer 305 is planarized using chemical mechanical polishing (CMP) until the insulation layer 305 is flushed with the carbon nanotube electrodes 303 (i.e., until the carbon nanotube electrodes 303 are exposed substantially at the same level of the planarized insulation layer 305).

Figure 3E:
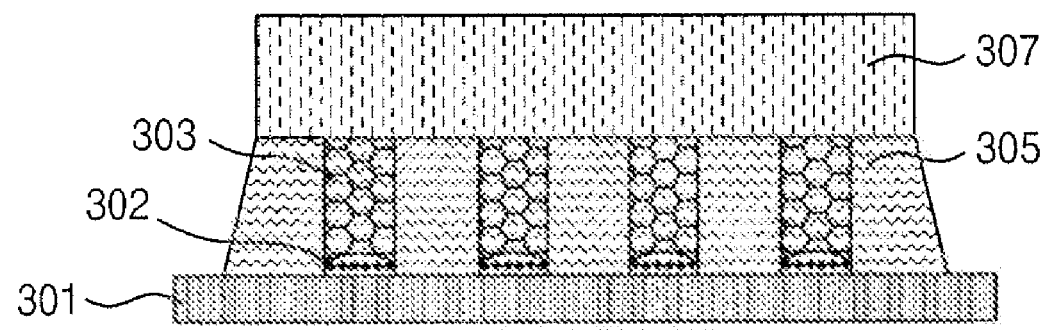

Referring to FIG. 3e, a phase change material layer 307 is deposited over the planarized insulation layer 305 such that the phase change material layer 307 and the carbon nanotube electrodes 303 make contact with each other. At this point, the contact area between the phase change material layer 307 and the carbon nanotube electrodes 303 is a sectional area corresponding to the diameter of each of the carbon nanotube electrodes 303. That is, the contact area between the phase change material layer 307 and the carbon nanotube electrodes 303 is small, being close to a dot-like form.

On the basis of the above described sequential processes, the phase change memory device with the carbon nanotube-based bottom electrodes can be fabricated.

Figure 4:
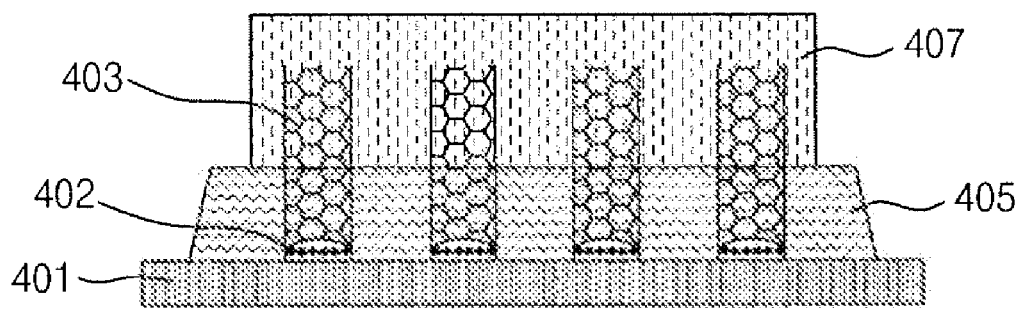
FIG. 4 is a sectional view of a phase change memory device structure according to another embodiment of the present invention.

FIG. 4 is a sectional view of a phase change memory device structure accruing to another embodiment of the present invention.

The phase change memory device according to the other embodiment of the present invention comprises a current source electrode 401, a phase change material layer 407, a plurality of carbon nanotube electrodes 403, and an insulation layer 405. The current source electrode 401 supplies external current, which is necessary for inducing a phase change, to a target. The phase change material layer 407 is disposed to face the current source electrode 401 in side direction. The carbon nanotube electrodes 403 are arranged between the current source electrode 401 and the phase change material layer 407, and one portion of the carbon nanotube electrodes 403 extends to the phase change material layer 407, thereby overlapping with the phase change material layer 407. The insulation layer 405 is formed to encompass the outside of the carbon nanotube electrodes 403 formed between the current source electrode 401 and the phase change material layer 407. The insulation layer 405 particularly prevents the loss of heat generated at the carbon nanotube electrodes 403 to the outside.

An overlapping length of the carbon nanotube electrodes 403 with the phase change material layer 407 may be approximately $1/10$ to $8/10$ of the entire length of the carbon nanotube electrodes 403.

Different from the phase change memory device according to the embodiment of the present invention, wherein the carbon nanotube electrodes are formed to contact the phase change material layer, the carbon nanotube electrodes 403 in the phase change memory device according to the other embodiment of the present invention extend to the phase change material layer 407 to overlap with the phase change material layer 407. As mentioned above, the carbon nanotube electrodes 403 are used as the current passage between the current source electrode 401 and the phase change material layer 407. Due to this overlapping structure, heat generated at the carbon nanotube electrodes transfers to the phase change material layer 407 that causes a phase change, enlarging the area of the phase change material layer 407 to a great extent.

Accordingly, the phase change memory device according to the other embodiment of the present invention can maintain high current density even with a small amount of operation current. Also, a threshold voltage margin of the phase change memory device is improved, and this effect allows the implementation of the MLC technology that enables storage of information in several bits on a single device.

A method for fabricating the phase change memory device according to the other embodiment of the present invention further comprises selectively etching the insulation layer 405 after polishing the insulation layer described in the fabrication method according to the embodiment of the present invention.

That is, the method for fabricating the phase change memory device according to the other embodiment of the present invention comprises disposing a catalyst 402 for forming a plurality of carbon nanotubes over predetermined regions of the current source electrode 401 that supplies external current necessary for inducing a phase change to a target; vertically growing carbon nanotubes using the catalyst 402 as a seed; depositing the insulation layer 405 over the current source electrode 401 in a manner to cover the carbon nanotube electrodes 403; polishing the insulation layer 405 until flush with the carbon nanotube electrodes 403; selectively etching the insulation layer 405 to make the exposed carbon nanotube electrodes 403 exposed substantially at the same level of the planarized insulation layer 405 protrude; and forming the phase change material layer 407 over the insulation layer 405 such that the protruding carbon nanotube electrodes 403 overlap with the phase change material layer 407.

When selectively etching the insulation layer 405 to make the exposed carbon nanotube electrodes 403 protrude, since the protruding portions of the carbon nanotube electrodes 403 overlap with the phase change material layer 407, the insulation layer 405 is etched until the length of the protruding portions of the carbon nanotube electrodes 403 is in a range of approximately $1/10$ to $8/10$ of the entire length of the carbon nanotube electrodes 403.

Herein, those elements and fabrication processes of the second exemplary phase change memory device that are similar to or same as those described in the above embodiment of the present invention will not be described in detail.

Figure 5:
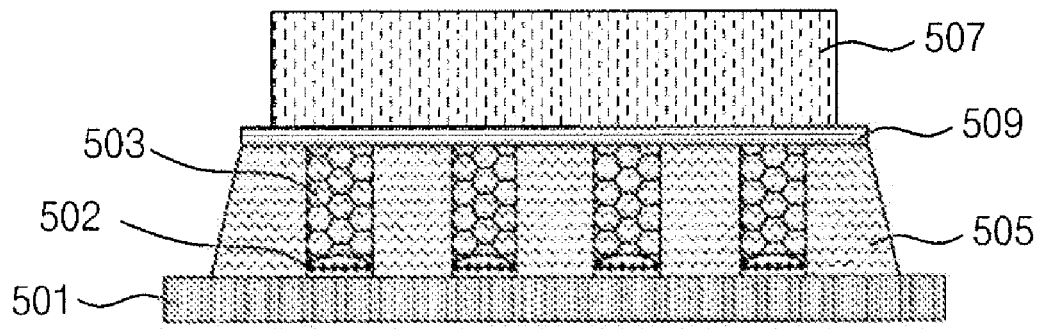
FIG. 5 is a sectional view of a phase change memory device structure according to further another embodiment of the present invention.

FIG. 5 is a sectional view of a phase change memory device structure according to further another embodiment of the present invention.

The phase change memory device according to the further embodiment of the present invention further comprises a heat generating resistance layer 509 that has high resistance to overcome low heat efficiency caused by the low resistance of the carbon nanotube electrodes in the phase change memory device according to the embodiment of the present invention.

In more detail, the phase change memory device according to the further embodiment of the present invention comprises a current source electrode 501, a phase change material layer 507, a plurality of carbon nanotube electrodes 503, an insulation layer 505, and a heat generating resistance layer 509. The current source electrode 501 supplies external current necessary for inducing a phase change to a target. The phase change material layer 507 is disposed to face the current source electrode 501 in side direction. The carbon nanotube electrodes 503 are disposed between the current source electrode 501 and the phase change material layer 507. The insulation layer 505 is formed to encompass the outside of the carbon nanotube electrodes 503, and functions to prevent the loss of heat generated at the carbon nanotube electrodes 503 to the outside. The heat generating resistance layer 509 is disposed between the carbon nanotube electrodes 503 and the phase change layer 507 in contact with the carbon nanotube electrodes 503.

When the carbon nanotube electrodes 503 are used as the current passage, electrons are less likely to scatter in the direction of growing the carbon nanotubes. Thus, the carbon nanotube electrodes 503 allow a flow of a large amount of current, e.g., approximately $10^{10}$ Acm$^{-2}$. Although the carbon nanotubes are advantageous of obtaining high current density or conducting current, when the carbon nanotubes are used as a heat generating material, a sufficient amount of heat that causes a phase change in the phase change material may not be generated due to the low resistance of the carbon nanotubes.

Therefore, the heat generating resistance layer 509 is deposited thinly between the carbon nanotube electrodes 503 and the phase change material layer 507 in contact with the phase change material layer 507. As a result, the high current density of the carbon nanotube electrodes 503 is provided to the heat generating resistance layer 509. Consequently, the heat generation efficiency can be improved using the high resistance of the heat generating resistance layer 509.

The heat generating resistance layer 509 comprises one selected from a group consisting of W, Mo, Ta, Ni, Cr, and nichrome.

A method for fabricating the phase change memory device according to the further embodiment of the present invention comprises disposing a catalyst 502 for forming a plurality of carbon nanotubes over predetermined regions of the current source electrode 502 supplying external current necessary for inducing a phase change; vertically growing carbon nanotubes using the catalyst 502 as a seed to thereby form the carbon nanotube electrodes 503; depositing the insulation layer 505 over the current source electrode 501 in a manner to cover the carbon nanotube electrodes 503; polishing the insulation layer 505 until the insulation layer is flushed with the carbon nanotube electrodes 503; depositing the heat generating resistance layer 509 in contact with the carbon nanotube electrodes exposed substantially at the same level of the planarized insulation layer 505; and forming the phase change material layer 507 over the heat generating resistance layer 509.

Herein, those elements and fabrication processes of the third exemplary phase change memory device that are similar to or same as those described in the above embodiment of the present invention will not be described in detail.

Instead of carbon nanotubes, dot-shaped electric hot-wires can be formed using silicon nanowires, SiGe nanowires, or ZnO nanowires as a heat generating material, and can function as the current passage between the current source electrode and the phase change material layer.

According to various embodiments of the present invention, the phase change memory device uses carbon nanotubes to form the typical bottom electrodes. Thus, the phase change memory device can maintain the high current density even with a small amount of operation current as compared with the typical phase change memory device. Also, a threshold voltage margin of the phase change memory device according to the embodiments of the present invention can be increased, and as a result, the MLC technology can be implemented to the phase change memory device.

In addition, since the phase change memory device according to the embodiments of the present invention can be scaled down, a large amount of operation current, which is the typically observed limitation in achieving the large scale of integration, can be overcome. Furthermore, the phase change memory device according to the embodiments of the present invention can be highly integrated and operate at low power with high efficiency.

While the present invention has been described with respect to specific embodiments, it will be apparent to those skilled in the art that various changes and modifications may be made without departing from the spirit and scope of the invention as defined in the following claims.

Since the specific embodiments of the present invention are provided to show the technical scope and spirit of the present invention, these embodiments should not be construed as limitive but merely illustrative, and are intended to be included within the scope of the following claims.

What is claimed is:

1. A method for fabricating a phase change memory using carbon nanotubes, the method comprising:
   disposing a catalyst for forming a plurality of carbon nanotubes over predetermined regions of a current source electrode supplying external current to a target, thereby widening the predetermined regions responsible for the phase change and increasing the threshold margin of a phase change material;
   growing the carbon nanotubes in vertical direction using the catalyst as a seed to form carbon nanotube electrodes;
   depositing an insulation layer over the current source electrode in a manner to cover the carbon nanotube electrodes;
   polishing the insulation layer until flush with the carbon nanotube electrodes to form a planarized insulation layer flush with the carbon nanotube electrodes; and
   forming a phase change material layer over the planarized insulation layer, which is flush with the carbon nanotube electrodes, in contact with the carbon nanotube electrodes.

2. The method of claim 1, wherein disposing the catalyst over the predetermined regions of the current source electrode comprises forming the catalyst using one selected from a group consisting of Fe2O3, Pt, Go, Ni, Ti, Mo, and a combination thereof.

3. The method of claim 1, wherein growing the carbon nanotubes in vertical direction using the catalyst as the seed comprises forming the carbon nanotube electrodes in a single wall type.

4. The method of claim 1, wherein growing the carbon nanotubes in vertical direction using the catalyst as the seed comprises forming the carbon nanotube electrodes to have a diameter ranging from approximately 1 nm to 100 nm.

5. A method for fabricating a phase change memory using carbon nanotubes, the method comprising:
   disposing a catalyst for forming a plurality of carbon nanotubes over predetermined regions of a current source electrode supplying external current to a target, thereby widening the predetermined regions responsible for the phase change and increasing the threshold margin of a phase change material;
   growing the carbon nanotubes in vertical direction using the catalyst as a seed to form carbon nanotube electrodes;
   depositing an insulation layer over the current source electrode in a manner to cover the carbon nanotube electrodes;
   polishing the insulation layer until flush with the carbon nanotube electrodes;
   selectively etching the planarized insulation layer to make the carbon nanotube electrodes exposed substantially at the same level of the planarized insulation layer protrude; and
   forming a phase change material layer over the planarized insulation layer such that the carbon nanotube electrodes overlap with the phase change material layer.

6. The method of claim 5, wherein disposing the catalyst over the predetermined regions of the current source electrode comprises forming the catalyst using one selected from a group consisting of Fe2O3, Pt, Co, Ni, Ti, Mo, and a combination thereof.

7. The method of claim 5, wherein growing the carbon nanotubes in vertical direction using the catalyst as the seed comprises forming the carbon nanotube electrodes in a single wall type.

8. The method of claim 5, wherein growing the carbon nanotubes in vertical direction using the catalyst as the seed comprises forming the carbon nanotube electrodes to have a diameter ranging from approximately 1 nm to 100 nm.

9. The method of claim 5, wherein selectively etching the planarized insulation layer to make the exposed carbon nanotube electrodes protrude comprises etching the planarized insulation layer such that a protruding length of the carbon nanotube electrodes ranges from approximately 1/10 to 8/10 of the total length of the carbon nanotube electrodes.

10. A method for fabricating a phase change memory using carbon nanotubes, the method comprising:

disposing a catalyst for forming a plurality of carbon nanotubes over predetermined regions of a current source electrode supplying external current to a target, thereby widening the predetermined regions responsible for the phase change and increasing the threshold margin of a phase change material;

growing the carbon nanotubes in vertical direction using the catalyst as a seed to form carbon nanotube electrodes;

depositing an insulation layer over the current source electrode in a manner to cover the carbon nanotube electrodes;

polishing the insulation layer until flush with the carbon nanotube electrodes;

depositing a heat generating resistance layer over the planarized insulation layer to contact the carbon nanotube electrodes exposed substantially at the same level of the planarized insulation layer; and forming a phase change layer over the heat generating resistance layer.

11. The method of claim 10, wherein disposing the catalyst over the predetermined regions of the current source electrode comprises forming the catalyst using one selected from a group consisting of Fe2O3, Pt, Co, Ni, Ti, Mo, and a combination thereof.

12. The method of claim 10, wherein growing the carbon nanotubes in vertical direction using the catalyst as the seed comprises forming the carbon nanotube electrodes in a single wall type.

13. The method of claim 10, wherein growing the carbon nanotubes in vertical direction using the catalyst as the seed comprises forming the carbon nanotube electrodes to have a diameter ranging from approximately 1 nm to 100 nm.

* * * * *